(12) United States Patent
Vetter

(10) Patent No.: US 6,771,487 B1
(45) Date of Patent: Aug. 3, 2004

(54) POWER ELECTRONICS COMPONENT WITH IMPROVED THERMAL PROPERTIES

(75) Inventor: Harald Vetter, Heidenheim (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/979,327

(22) PCT Filed: Apr. 7, 2000

(86) PCT No.: PCT/DE00/01081

§ 371 (c)(1),
(2), (4) Date: Jul. 29, 2002

(87) PCT Pub. No.: WO00/65615

PCT Pub. Date: Nov. 2, 2000

(30) Foreign Application Priority Data

Apr. 21, 1999 (DE) .......................................... 199 18 090

(51) Int. Cl.[7] .............................................. H01G 2/10
(52) U.S. Cl. ..................................... 361/517; 361/521
(58) Field of Search ................................. 361/511, 512, 361/517–520, 534–538

(56) References Cited

U.S. PATENT DOCUMENTS

| 3,568,015 A | * | 3/1971 | Lobo ............................ 361/318 |
| 4,639,833 A | * | 1/1987 | Sato et al. ................... 361/315 |
| 4,747,013 A | * | 5/1988 | Dexel et al. ................. 361/272 |
| 4,760,494 A | * | 7/1988 | Crum ........................... 361/272 |
| 4,893,217 A |   | 1/1990 | Schweikert et al. |

FOREIGN PATENT DOCUMENTS

| DE | 18 14 099 | 9/1970 |
| DE | 211 22 83 | 8/1972 |
| DE | 35 12 159 A1 | 10/1986 |
| GB | 1 489 639 | 10/1977 |
| GB | 2 279 506 | 1/1995 |

* cited by examiner

Primary Examiner—Anthony Dinkins
(74) Attorney, Agent, or Firm—Schiff Hardin LLP

(57) ABSTRACT

A power electronics component having a housing a cover plate and an electrically active region. The electrically active region is disposed in the housing in such manner that a gap exists between the electrically active region and the inner wall of the housing. The gap is filled with a moisture absorbent bulk granular material.

9 Claims, 2 Drawing Sheets

POWER ELECTRONICS COMPONENT WITH IMPROVED THERMAL PROPERTIES

BACKGROUND OF THE INVENTION

1. Field of the Invention

The present invention is directed to power electronics components. In particular, the present invention is directed to power electronics components having an electrically active region and a housing.

2. Brief Discussion of the Related Art

In power electronics components such as power capacitors, phase modules for low-voltage reactive current compensation, or similar components, reliable heat elimination is of great significance. In other words, such components should have a low thermal resistance.

These components may be either dry, gas-impregnated or filled with oil or resin. Gas-impregnated components have a poorer thermal resistance than components filled with oil or resin. Compared to the latter however, gas-impregnated components are preferred in view of environmental pollution. Oil and resin filled components, as is well known, produce environmental problems that particularly occur when they are disposed of or when a fire takes place.

Power capacitors in particular can have either what are referred to as "Wet formats", wherein an oil impregnation or a semi-impregnation is used, or "dry formats", wherein a gas impregnation or a casting with materials such as epoxy resin, polyurethane resin or castor oil with a polyurethane curing agent is used. These materials can thereby have different viscosities whose range extends from hard to gelatinous.

All of these different versions are generally widespread and are marked by their own advantages and disadvantages in terms of production and operation of the power capacitors. For example, in addition to environmental problems, oil-impregnated components also have a higher fire risk.

In the decision as to whether "wet formats" or "dry formats" are to be used, consideration should be given to their properties with respect to flammability, creation of smoke and to toxicity. Specific casting compounds raise considerable problems in this respect.

In general, dry, gas-impregnated power capacitors are somewhat inferior to the "wet formats" in terms of thermal resistance, but raise fewer problems in view of environmental pollution. Thus, "dry formats" with gas impregnation are superior to wet formats during operation, and at the end of their service life, as well as in the event of a fire.

Another advantage of the "dry formats" rests in their substantially lower weight, compared to the "wet formats".

However, components having higher power handling capabilities, such as phase shifter capacitors suitable for low-voltage reactive current compensation in the range of approximately 25 kVAr through 50 kVAr, are currently in development. Thus, there is a tendency toward using higher currents in intermediate circuit capacitors and circuit capacitors used with IGBT (Insulated Gate Bipolar Transistor) frequency converters, wherein better thermal resistance is advantageous for components operating at higher power.

Given these considerations, moisture absorption in the case of the various formats must also be taken into account. In some applications, one must count on a finite moisture diffusion into the component housing, given cast versions, so that an adequate adsorption of moisture should be done for dependable operation.

SUMMARY OF THE INVENTION

It is an object of the present invention to create a power electronics component that will not cause environmental pollution when disposed of, has excellent thermal resistance, is capable of adsorbing moisture, and has a low weight.

This objective is achieved in a power electronics component, such as a power capacitor having an electrically active region, a winding, a housing, and a gap between the housing wall and the electrically active region, by filing the gap with a mineral bulk granular material.

According to the present invention, the mineral bulk granular material serves as an insulator, and fills the gap between a winding envelope and an inside housing wall in the power capacitor. On the basis of a suitable pre-treatment, the mineral bulk granular material can easily be placed in a position that it is capable of efficiently adsorbing moisture. Substances that have this property are often referred to as "molecular sieve". For example, synthetically produced zeolite with a crystalline lattice structure are such molecular sieves.

The granular material, as was already pointed out, is placed in the gap between the winding envelope and the inside housing wall. The granular material can be adequately compacted therein by shaking.

The molecular sieve property can be potentially foregone when the power electronics component is utilized in a dry environment. In this case, suitable materials with granulation can be selected for the granular material without having to pay attention to moisture adsorption.

Experiments carried out by the inventor on large phase shifter capacitors have shown that desirable thermal conduction properties were achieved without great financial outlay using a granular material as an insulator in the gap between the winding envelope and the inside housing wall, so that heat generated in the active region of the phase shifter capacitors, i.e. in the winding, can be effectively eliminated toward the outside. A granular material with a standard implementation has an apparent density of approximately 0.7 kg/dm, and is considerably lighter than oil or casting compound.

Thermal conduction of the granular material can be influenced with the apparent density. When a lower apparent density material is used the thermal conduction is lower than when a higher apparent density material is used.

The financial outlay for the granular material is extremely low and lies clearly below that for oil or for casting compound. In addition, the granular material can be concentrated in those regions in the component that are critical for the heat elimination, which is fundamentally not true of oil impregnation or casting compound.

Measurements for a 25 kVAr cylindrically encased phase shifter capacitor of the MKKAC (Metallized Plastic Capacitor, Alternating Current) type show that what is referred to as the "hot spot" temperature, i.e. hottest location in the capacitor, given a reactive power of 50 kVAr, can be lowered by 7° K. with a fill of granular material in the gap between the winding envelope and the inside housing wall, compared to a gas-impregnated version. Comparative tests of power capacitors with gas impregnation, oil impregnation, casting resin impregnation, and granular material in the gap between the winding envelope and the inside housing wall clearly yield the best result for a power capacitor having granular material in the gap.

The considerable reduction in thermal resistance encourages development of power capacitors having higher power handling capabilities.

The good adsorption properties of the granular molecular sieve material also have a positive influence on the service life of a power capacitor with a dry format. Also, demands made during manufacturing and testing can be considerably reduced, which leads to a cost reduction in manufacture. Moisture adsorption of the granular molecular sieve material also enable design concepts with partial plastic covering in the terminal region of large rectangular capacitors. Plastic coverings or casting compounds always exhibit pronounced moisture diffusion, so that the material data known therefrom can be used to define a quantity of granular material, such that the granular material absorbs any moisture that diffuses into the component over its entire service life.

Preferably, the power electronics component of the present invention is a power capacitor. However, it can also be some other component, such as an inductance or a power semiconductor component, whereby good heat elimination is needed.

The granular material does not raise any environmental problems since its basic mineral material is also thermally stable in case of fire and thus does not exhibit a toxic effect or cause a greenhouse environmental problem. Further, a reduced amount of granular material is needed if the moisture absorbing properties of the material are carefully chosen. Compared to oil and casting compounds, the granular material offers a significant weight advantage with an apparent density of approximately 0.7 kg/dm. Further, the granular material can easily be concentrated into the gap between the component housing and the electrical winding, so that both the cost outlay for the granular material needed and the weight of the power component can be reduced.

If the core tube in a power capacitor is also filled, then a higher hot spot temperature results, and the thermal resistance is unfavorably influenced. However, the advantages over oil and casting become especially clear when the granular material is introduced only into the gap between the winding and the housing. Compared to a casting material, no complicated apparatus is required for the introduction of the granular material. Thus, the equipment used for casting can be eliminated. Processing problems associated with handling the granular material are virtually non-existent. Thus, no whiteroom is required. Further, the granular material displaces a considerable part of the residual volume, specifically in the case of rectangular capacitors, so that gas impregnation with pure $SF_6$ becomes possible, thus resulting in significant lengthening of the service life of the capacitor.

The power electronics component of the present invention comprising a mineral, bulk granular material in the gap between an active region and a housing spaced therefrom combines the advantages of a gas-impregnated component with the advantages of an oil or resin filled component and also has excellent moisture adsorption benefits.

DETAILED DESCRIPTION OF THE PRESENTLY PREFERRED EMBODIMENTS

Figure 1:
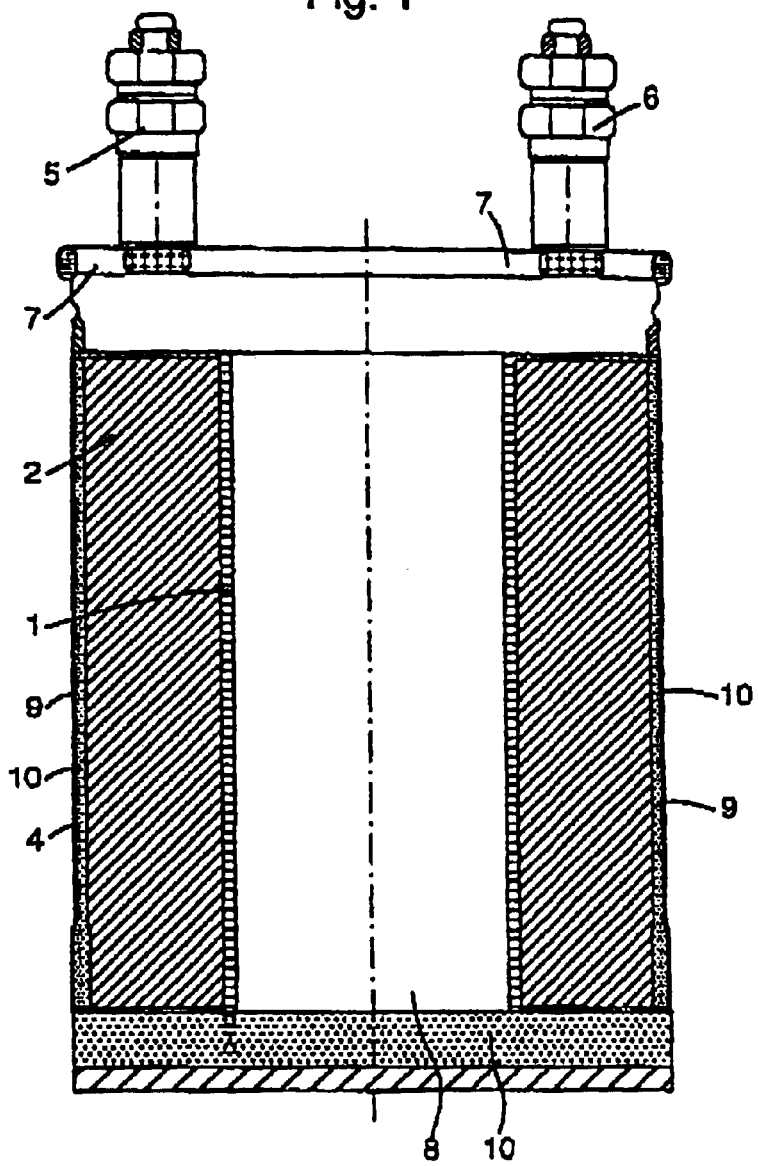
FIG. 1 shows a schematic view of a first wound capacitor according to the present invention.

FIG. 1 shows a wound capacitor composed of a core tube 1 surrounded by one or more windings 2. When a plurality of windings 2 are present, they are separated from one another by a parting layer of insulating material. For the present invention, it is of no consequence whether the wound capacitor has one or more windings 2. The windings 2 are in turn accommodated in an outside housing tube 4 that is cylindrically fashioned, surrounds the winding 2 as well as the core tube 1 like an envelope, and can have its ends provided with plastic cover plates.

Electrical feed to the windings 2 is made via terminals 5, 6 provided at the cover side of the wound capacitor, and fixed thereat and electrically insulated in a ring flange 7. Electrical terminal 5 thereby leads to the inside of an inner winding, whereas the electrical terminal 6 is connected to the inside of an outer winding. The two windings are in electrical communication with one another at the bottom side by the schoopage layer.

The gap 9 and the inside space 8 of the core tube between the outside of the winding 2 (the winding envelope) and the inside of the outside housing tube 4 (inside housing wall) in this wound capacitor is filled with a granular material 10 that, for example, is adequately compressed by shaking and also fills out the bottom region between inside housing wall and winding. This granular material can also comprise a molecular sieve property when moisture absorption is particularly important. Synthetically produced zeolites with crystalline lattice structure can be employed as granular material. Alternatively, silica sands or the like are suitable when the adsorption can be foregone.

Figure 2:
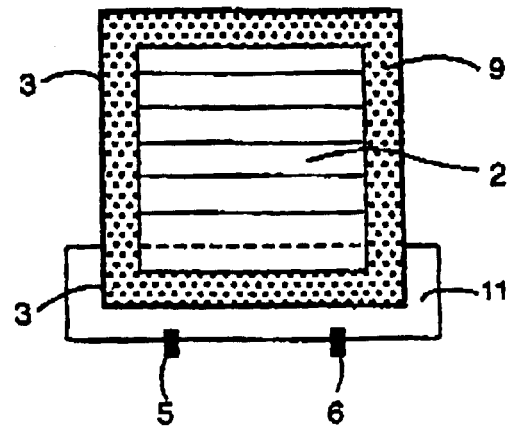
FIG. 2 shows a schematic view of a second wound capacitor according to the present invention.

In the embodiment of FIG. 2, the entire gap 9 between the winding 2 and a housing 3 is filled with the granular material 10. Here, the housing 3 can sit on a platform 11 with terminals 5, 6.

The granular material 10 has an apparent density of approximately 0.7 kg/dm and is lighter than oil of casting compound, thus the wound capacitor can be manufactured with low weight. The thermal conductivity of the granular material is clearly superior to that of gas, as will be explained below on the basis of FIG. 3.

Figure 3:
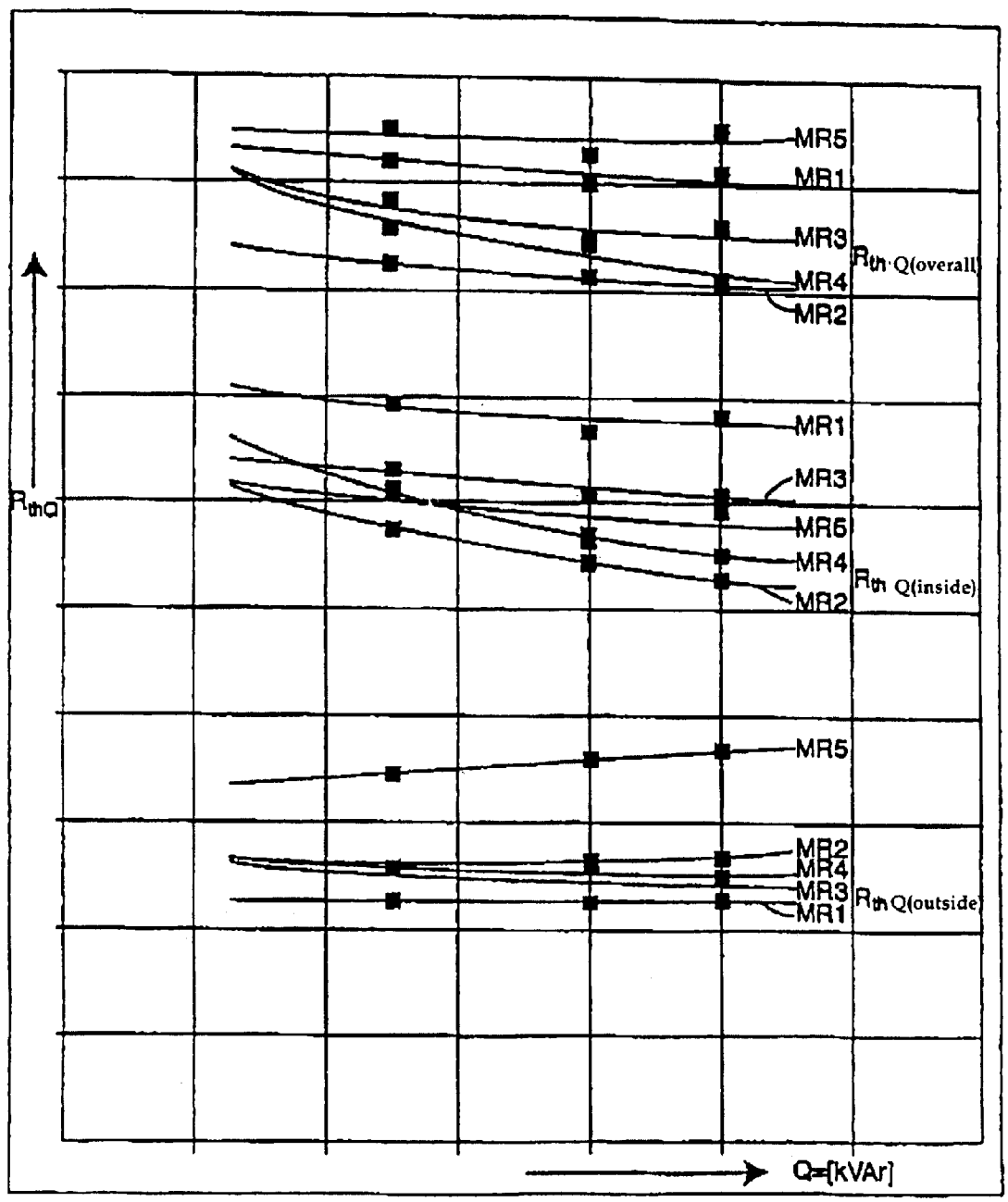
FIG. 3 shows a diagram wherein the thermal resistance $R_{th}$ is dependant on the reactive power for various fills of capacitor according to the present invention.

In FIG. 3, the ordinate shows the transformed thermal resistance $R_{thQ}$ in °K/kVAr dependent on the reactive power Q in kVAr. The curve $R_{thQ(total)}$ thereby denotes the overall thermal resistance between hot spot and environment, $R_{thQ(inside)}$ denotes the thermal resistance between hot spot and inside housing wall, and $R_{thQ(outside)}$ denotes the thermal resistance between housing and environment.

Curves MR1 indicate the measured results for an air-filled gap, whereas curves MR2 show measured results for granular material in the gap, curves MR3 stand for measured results for granulate in the gap and core tube 1, curves MR4 represent measured results for an oil-impregnated wound capacitor, and curves MR5 reflect measured results for a wound capacitor with cast fill.

It can be seen that the curves MR2 exhibit the lowest thermal resistance overall, i.e., a fill of granular material in the gap between winding envelope and inside housing wall is to be preferred.

Tests were carried out at a 25 kVAr MKK-AC capacitor with black surface with various reactive powers Q and different filling agents (air, molecular sieve granules in the gap between the winding envelope and the inside housing wall—i.e. the core tube is not filled, and molecular sieve granules are distributed in the entire capacitor, oil fill and resin fill).

Table 1 shows a compilation of results.

TABLE 1

| Filling agent | Q = 25 kVAr ?T$_{A-hs}$[K] | Relative comparison [K] | Q = 50 kVAr ?T$_{A-hs}$[K] | Relative comparison [K] |
| --- | --- | --- | --- | --- |
| Air | 22.9 | ?0.0 | 46.1 | ?0.0 |
| Granular material in the gap | 20.5 | −2.4 | 40.0 | −6.1 |
| Granular material in entire the capacitor | 22.1 | −0.8 | 42.8 | −3.3 |
| Oil fill | 21.5 | −1.4 | 40.7 | −5.4 |
| Resin fill | 23.7 | +0.8 | 47.5 | +1.4 |

According to present invention, the filling agents of oil and molecular sieve granules yield a more favorable thermal resistance Rh$_{th\_}$ than air.

Moreover, in the gap, the resin fill is better than air by a factor of 2 and is thus comparable to the oil fill or, to the molecular sieve granules. But, due to the process-conditioned, complete filling of the capacitor, including core tube, with resin, no advantage occurs for R$_{th}$ overall.

In addition, the best results are achieved with the molecular sieve granules in the gap between winding envelope and inside housing wall, i.e. core tube not filled.

Although modifications and changes may be suggested by those skilled in the art to which this invention pertains, it is the intention of the inventor to embody within the patent warranted hereon, all changes and modifications that may reasonably and properly come under the scope of his contribution to the art.

What is claimed is:

1. A power electronics component, comprising:
   a housing having an inner wall;
   an electrically active region arranged in said housing to define a gap between said electrically active region and said inner wall; and
   bulk mineral granular material provided in said gap so as to fill said gap between said electrically active region and said inner wall so that said gap is filled with dry material.

2. A power electronics comment according to claim 1, wherein said bulk mineral granular material is a granular molecule sieve material.

3. A power electronics component according to claim 1, wherein said bulk mineral granular material comprises zeolites having crystalline lattice structure.

4. A power electronics component according to claim 1, wherein said bulk mineral granular material is moisture absorbent.

5. A power electronics component according to claim 1, wherein said housing is proved with plastic cover plates.

6. A power electronics component according to claim 1, wherein said power component is a power capacitor.

7. A power electronics component according to claim 1, wherein said power component is a phase component.

8. A power electronics component, comprising:
   a housing having an inner wall;
   an electrically active region arranged in said housing to define a gap between said electrically active region and said inner wall; is filled with
   bulk mineral granular material filling said gap between said electrically active region and said inner wall, said bulk mineral granular material exhibits an apparent density of approximately 0.7 kg/dm$^3$.

9. A capacitor, comprising:
   a housing defining an interior space and having an interior wall;
   a capacitor element of alternating conductive and dielectric materials, said capacitor element being in said housing and defining a gap between said capacitor element and said interior wall of said housing;
   terminals on said housing, said terminals being electrically connected to said capacitor element; and
   granular material substantially filling said gap between said interior wall and said capacitor element, said granular material being substantially free of oil and being compressed in said gap.

* * * * *